(12) United States Patent
Brey et al.

(10) Patent No.: US 9,185,803 B2
(45) Date of Patent: Nov. 10, 2015

(54) CIRCUIT BOARD FOR ELECTRIC COMPONENTS AND CIRCUIT BOARD SYSTEM

(75) Inventors: Roland Brey, Eschlkam (DE); Andreas Bernhardt, Wenzenbach (DE)

(73) Assignee: Continental Automotive GmbH, Hannover (DE)

( * ) Notice: Subject to any disclaimer, the term of this patent is extended or adjusted under 35 U.S.C. 154(b) by 16 days.

(21) Appl. No.: 14/122,026

(22) PCT Filed: May 22, 2012

(86) PCT No.: PCT/EP2012/059482
§ 371 (c)(1),
(2), (4) Date: Nov. 25, 2013

(87) PCT Pub. No.: WO2012/160059
PCT Pub. Date: Nov. 29, 2012

(65) Prior Publication Data
US 2014/0085827 A1    Mar. 27, 2014

(30) Foreign Application Priority Data
May 23, 2011   (DE) .................. 10 2011 076 273

(51) Int. Cl.
*H05K 1/18* (2006.01)
*H05K 1/02* (2006.01)
*H01L 23/538* (2006.01)
*H05K 3/20* (2006.01)
(Continued)

(52) U.S. Cl.
CPC ................ *H05K 1/18* (2013.01); *B60L 3/0084* (2013.01); *B60L 11/005* (2013.01); *B60L 11/14* (2013.01); *H01L 23/5389* (2013.01); *H05K 1/0203* (2013.01); *H05K 1/185* (2013.01); *H05K 3/202* (2013.01); *B60L 2240/36* (2013.01); *H01L 2224/32245* (2013.01); *H01L 2924/13091* (2013.01); *H05K 1/0263* (2013.01); *H05K 3/4641* (2013.01); *H05K 3/4691* (2013.01); *H05K 2201/10166* (2013.01); *H05K 2201/10272* (2013.01); *Y02T 10/70* (2013.01); *Y02T 10/7022* (2013.01); *Y02T 10/7077* (2013.01)

(58) Field of Classification Search
CPC ....... H05K 1/18; H05K 1/0203; H05K 1/185; H05K 3/202; H01L 23/5389
USPC .......... 174/250, 260, 252; 361/760, 761, 764, 361/783, 704
See application file for complete search history.

(56) References Cited

U.S. PATENT DOCUMENTS 4,630,174 A   12/1986   Kaufman
6,469,907 B1   10/2002   Favluke et al.
(Continued)

FOREIGN PATENT DOCUMENTS

DE   102004018469 B3   10/2005
DE   102009029476 A1   3/2011
(Continued)

*Primary Examiner* — Timothy Thompson
*Assistant Examiner* — Amol Patel
(74) *Attorney, Agent, or Firm* — Laurence A. Greenberg; Werner H. Stemer; Ralph E. Locher

(57) ABSTRACT

A circuit board for electric components has at least one current conductor, which is configured as a molded part, and at least one unhoused electric component affixed to the current conductor. The circuit board exhibits improved operating reliability.

14 Claims, 3 Drawing Sheets

(51) Int. Cl.
*B60L 3/00* (2006.01)
*B60L 11/00* (2006.01)
*B60L 11/14* (2006.01)
*H05K 3/46* (2006.01)

(56) References Cited

U.S. PATENT DOCUMENTS

| | | | |
|---|---|---|---|
| 6,882,538 B1 * | 4/2005 | Frisch | 361/728 |
| 7,393,236 B2 | 7/2008 | Thompson et al. | |
| 7,800,213 B2 | 9/2010 | Bayerer | |
| 2007/0059918 A1 | 3/2007 | Jung et al. | |
| 2009/0161301 A1 | 6/2009 | Woody et al. | |
| 2009/0178828 A1 * | 7/2009 | Tsumura et al. | 174/252 |
| 2010/0258367 A1 * | 10/2010 | Venturi | 180/65.21 |
| 2012/0236504 A1 | 9/2012 | Wortberg et al. | |

FOREIGN PATENT DOCUMENTS

| | | | |
|---|---|---|---|
| JP | 2002127920 A | | 5/2002 |
| JP | 2003501812 A | | 1/2003 |
| JP | 2005223223 A | * | 8/2005 |
| JP | 2008153582 A | | 7/2008 |
| JP | 2008251671 A | | 10/2008 |
| JP | 2010129604 A | * | 6/2010 |
| JP | 2010251551 A | | 11/2010 |
| JP | 2011023384 A | | 2/2011 |
| WO | 2007028039 A2 | | 3/2007 |

* cited by examiner

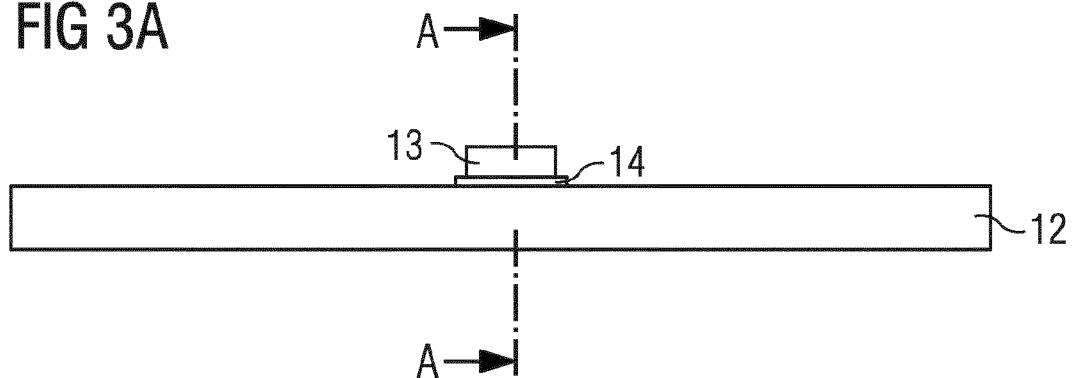
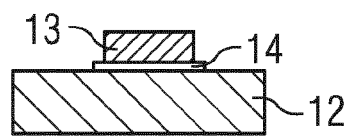
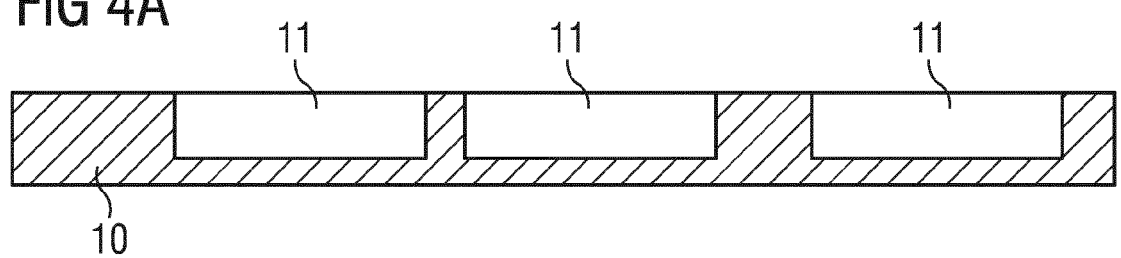
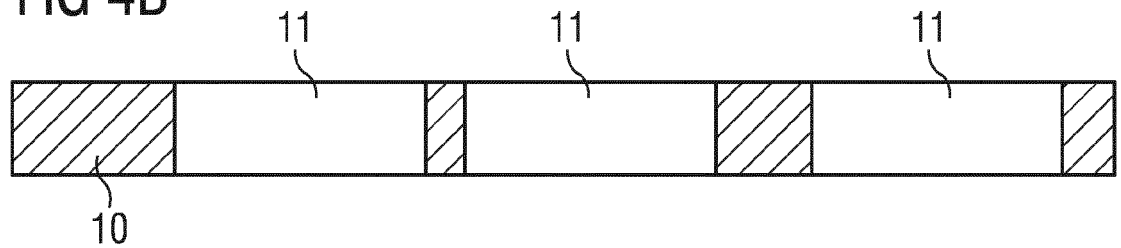

CIRCUIT BOARD FOR ELECTRIC COMPONENTS AND CIRCUIT BOARD SYSTEM

BACKGROUND OF THE INVENTION

Field of the Invention

The invention relates to a circuit board for electric components, in particular for use in hybrid vehicles or electric vehicles, a circuit board system and a motor vehicle comprising such a circuit board.

Efforts to achieve further reductions in fuel consumption and pollutant emissions of modern motor vehicles are increasingly involving the use of electric motors alone (electric vehicle) or in combination with an internal combustion engine (hybrid vehicle) as a drive in motor vehicles. The electric motors are usually supplied with electrical energy by means of electrochemical and/or electrostatic energy accumulators. In order to generate a sufficiently high drive power, the current flowing between the energy accumulator and the electric motor can have current strengths of several hundred to over 1000 amperes.

Such high current strengths require a correspondingly adapted electronic control and switching system. The distribution of current between the specified components is usually carried out here using power semiconductor switches, preferably MOSFETs. These semiconductor switches are embodied in such a way that they can also reliably switch current with such high current strengths. In this context, these switching elements are subjected to particularly high generation of heat with the result that sufficiently good cooling is necessary to avoid overheating of these switching elements. These are housed switching elements in which the semiconductor element (the actual semiconductor switch) is arranged together with a usually metallic heat sink in a common housing. The heat sink (also referred to as a heat slug) is usually embodied as a cooling body which is integrated into the housing and which lies exposed on the housing floor. As a rule, these components are mounted on a circuit board and contact is made between the connecting legs and the current-conducting conductors. This heat sink is connected in a thermally conductive fashion to the circuit board by means of the solder, with the result that it is possible to conduct away heat from the actual semiconductor switch to the circuit board. Shrinkage cavitations and occlusions of air in the solder underneath the heat sink can reduce the conduction away of heat. As a result, the component is at risk of overheating, and therefore the operational reliability of the entire switching device is compromised.

BRIEF SUMMARY OF THE INVENTION

The object of the present invention is to make available a circuit board, a circuit board system and a motor vehicle which is defined by a raised level of operational reliability.

This object is achieved by means of the circuit board, the circuit board system and the motor vehicle according to the independent claims. Advantageous refinements of the invention are described by the dependent claims.

A circuit board for electric components as claimed has at least one current conductor which is embodied as a molded part. The circuit board also has at least one unhoused electric component which is attached directly to the current conductor.

The idea on which the invention is based is to be considered that the component through which current with a high current strength flows, and which is subjected to high thermal loading, is to be configured as an unhoused component and arranged directly on, or attached to, the current conductor. The current conductor which is embodied as a solid molded part has a high thermal capacity, with the result that very good cooling of the electric component ensure as a result of the heat-conducting contact between the electric component and the current conductor. As a result, the quality of the heat-conducting connection of the component to the current conductor proves to be less critical than is the case, for example, with the arrangements known from the prior art. The circuit board is accordingly defined by significantly improved cooling of the component, as a result of which the risk of overheating of the electric component is significantly reduced. The operational reliability of the circuit board is thereby significantly improved.

In one refinement of the circuit board as claimed, the at least one current conductor is embodied as a solid ribbon conductor with a rectangular cross section.

In a further refinement of the circuit board as claimed, the at least one current conductor is designed in such a way that it is capable of conducting current with current strengths above 500 amperes.

Current conductors which are embodied in such a way can be manufactured very cost-effectively from extruded profiles. The embodiment as a ribbon conductor also permits very easy and unproblematic mounting of the unhoused electric component directly onto the current conductor.

In one refinement of the circuit board as claimed, the at least one unhoused electric component is attached to the current conductor by means of an intermediate layer made of heat-conducting material.

Possible materials for attaching the electric component to the current conductor are, for example solder, conductive adhesive or heat-conducting films which are adhesive on both sides. As a result of the direct thermal connection of the unhoused electric component to the current conductor, air occlusions or shrinkage cavitations reduce the thermal conductivity of this layer but not to such an extent that the component is damaged.

In one refinement of the circuit board as claimed, the latter has a carrier body and at least one layer of electrically insulating material, which covers the at least one current conductor and the at least one unhoused electrical component at least to some extent. The layer of electrically insulating material is formed with at least one breakthrough, through which at least the unhoused electric component can be electrically contacted.

The layer on insulating material can be composed, for example, of continuous fibers which are embedded in a duroplast plastic matrix and harden at high temperatures. This fiber matrix, also referred to as "Prepreg" in the specialist jargon, can be easily machine-processed. The at least one breakthrough can be milled over a large area and configured as a drilled hole or micro via. In this way the current conductor and/or the unhoused electric component can be reliably electrically insulated and the electrical contact can be made with them in a targeted fashion by means of the breakthroughs in the electrically insulating layer.

In one refinement of the circuit board as claimed, the latter has at least two current conductors which are embodied as a molded part, wherein the at least one unhoused electric component is a semiconductor switch which is attached to one of the current conductors and is electrically connected to the second conductor to the at least one breakthrough in the electrically insulating layer. The unhoused electric component which is embodied as a semiconductor switch can be, for example, a MOSFET. The latter is capable of also switching current with a high current strength of over 500 to over 1000 amperes. As a result of the arrangement, the high level of heat generated in the semiconductor switch is directly conducted away to the current conductor embodied as a molded part, which leads to reliable cooling of the semiconductor switch. Overheating and therefore damage to the semiconductor switch are avoided, as a result of which the switching unit in its operational reliability is significantly improved.

In one refinement of the circuit board as claimed, the latter has at least one electronic control system which is electrically connected to the unhoused electric component through the breakthrough.

By forming breakthroughs in the electrically insulating layer it is possible to make contact between the unhoused electric component and not only other current conductors but also with any other electric components of the circuit board. There may therefore be an electronic control system which, depending on the embodiment of the unhoused electric component, can feed control signals to the latter or else extract data therefrom (for example if the electric component is a sensor). This refinement therefore implements an electrical connection of the unhoused electric component to an electronic control system in a simple, cost-effective and operationally reliable fashion.

In one refinement of the circuit board as claimed, the carrier body has at least one cutout for accommodating the current conductor. The current conductor is arranged in the cutout of the carrier body here.

In this refinement of the circuit board, the at least one current conductor is integrated into the carrier body of the circuit board. The cutouts for accommodating the current conductors can be embodied, for example, as a depression or as a breakthrough in the carrier body. In the case of a depression, the current conductor arranged therein is exposed on only one side, while it is electrically insulated via the carrier material on all the other sides. If the cutout is embodied as a breakthrough, the current conductor which is arranged therein is freely accessible on two sides opposite one another, with the result that on both sides it is possible to mount unhoused electric components. The integration of the current conductor into the circuit board also has the advantage that further electric components can be arranged on the circuit board, and therefore power electronics can be combined with conventional electronics. As a result, a particularly high integration density is achieved, which provides a saving in terms of installation space and costs.

In one refinement of the circuit board as claimed, the latter has a layer made of electrically conductive material, which layer is applied to the electrically insulating layer and is embodied as an electrical conductor structure. The unhoused electric component is electrically connected to the electrically conductive layer through the at least one breakthrough in the electrically insulating layer.

The layer made of electrically conductive material is preferably composed of copper or a copper alloy. The conductor structure can be generated by an etching process. With this refinement, it is therefore possible to connect the unhoused electric component via the breakthrough in the electrically insulating layer to the electrical conductor structure and therefore connect it to further components or current conductors at any other desired location on the circuit board.

A circuit board system as claimed has at least a first circuit board as claimed and at least a second circuit board with electric components. The circuit board system also has a connecting section made of electrically insulating material, by means of which the first circuit board and the second circuit board are connected to one another.

In this circuit board system, two circuit boards are connected to one another which brings about a high integration density of the electronics arranged thereon. The circuit boards can be configured, for example, for different current strengths. It is therefore possible for the first circuit board to be configured for high current strengths of several 100 amperes up to over 1000 amperes, and the second circuit board is configured in the range of milliamperes. The circuit board system is distinguished by a small space requirement, cost-effective manufacture, short connecting paths and a high level of operational reliability.

In one refinement of the circuit board system as claimed, the connecting section is embodied as an electrically insulating layer between a main face of the first circuit board and a main face of the second circuit board.

Main faces are understood here to be the faces of the respective circuit board which can be equipped with electric components. The connecting section reliably electrically insulates from one another these two main faces which are possibly provided with components and an electrical conductor structure. At the same time, components or else current conductors of the first and second circuit boards can be combined with one another as desired over very short electric connecting paths.

In one refinement of the circuit board system as claimed, the first circuit board and the second circuit board have a common carrier body. A section of the common carrier body, located between the first circuit board and the second circuit board, constitutes the connecting section. The latter is shaped in such a way that two main faces of the first circuit board and of the second circuit board face one another.

In this refinement of the circuit board system, the main faces of the circuit board which are possibly provided with components and a conductor structure face one another but are electrically insulated from one another by an air gap. The shaping of the connecting section can be carried out, for example, in that the connecting section tapers in the cross section and is subsequently bent while being heated.

In one refinement of the circuit board system as claimed, the first circuit board and/or the second circuit board are embodied as a multi-layer circuit board.

In this way, further compression of the electronics and further reinforcement of the integration depths can be achieved.

In one refinement of the circuit board system as claimed, the second circuit board has an electronic control system.

In this refinement, the power electronics on the first circuit board are electrically insulated from the associated electronic control system on the second circuit board, but are integrated in the same circuit board system. This results in short transmission paths and a small installation space.

A motor vehicle as claimed has at least one electric motor generator and at least one electrical energy accumulator which is electrically connected to the motor generator. The motor vehicle also has a control device for controlling the flow of electrical energy between the at least one electrical energy accumulator and the at least one motor generator, wherein the control device has at least one circuit board as claimed. A circuit board as claimed or a circuit board system as claimed has high operational reliability and low manufacturing costs by virtue of a compact design. They are suitable, in particular, for controlling the flow of electrical energy between, for example, an electrochemical energy accumulator, an electrostatic energy accumulator for stabilizing the voltage and the motor generator.

BRIEF DESCRIPTION OF THE SEVERAL VIEWS OF THE DRAWING

The invention is explained below in more detail by means of exemplary embodiments and with reference to the appended figures, in which:

FIGS. 3A and 3B show schematic illustrations of a current conductor with an unhoused electric component;

FIGS. 4A and 4B show schematic illustrations of a carrier body of the circuit board;

DESCRIPTION OF THE INVENTION

Figure 1:
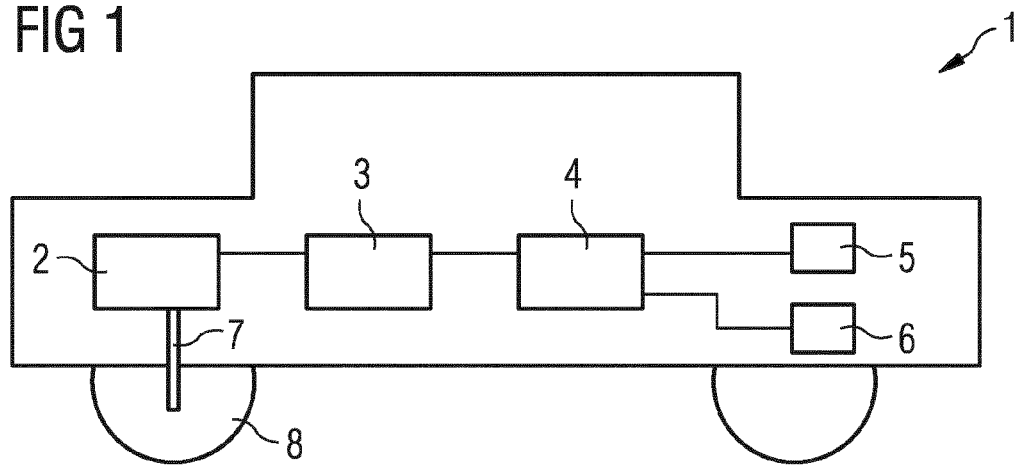
FIG. 1 shows a schematic illustration of a vehicle with a hybrid drive.

FIG. 1 is a schematic illustration of a motor vehicle 1 with a hybrid drive. The vehicle 1 has an internal combustion engine 2, an electric motor generator 3, a control device 4, an electrochemical energy accumulator 5 (battery) and an electrostatic energy accumulator 6 (one or more capacitors). The control device 4 is connected to the motor generator 3 and the electrical energy accumulators 5, 6 via electric leads.

The motor vehicle 1 can be driven solely by the internal combustion engine 2, solely by the motor generator 3 or by both at the same time, depending on the driving situation. For this purpose, the internal combustion engine 2 is connected via a drive train 7 to the drive wheels 8, with the result that a torque which is generated by the internal combustion engine 2 can be transmitted to the drive wheels. In the exemplary embodiment, the motor generator 3 is coupled to the internal combustion engine 2 in such a way that a torque which is generated by the motor generator 3 can drive the internal combustion engine 2, which is passed on in turn via the drive train 7 to the drive wheels. The motor generator 3 can act as an electric drive or as a generator, with the result that a torque which is generated by the internal combustion engine 2 can be converted by the motor generator 3 into electric current. This preferably takes place in an overrun mode of the motor vehicle.

The motor generator 3 is supplied in its function as an electric drive motor with electrical energy by the electrochemical energy accumulator 5 and/or the electrostatic energy accumulator 6. In its function as a generator, the electrical energy which is generated by the motor generator 3 is stored in the electrochemical energy accumulator 5 and in the electrostatic energy accumulator 6. The intermediately connected control device 4 controls the flow of current between the motor generator 3 and the electrical energy accumulators 5, 6. The current flowing in the process can have current strengths of several 100 amperes to 1000 amperes. For this reason, very high requirements in terms of operational reliability are made of the electronic circuitry contained in the control device 4.

In the text which follows, a circuit board and a circuit board system are presented which is a component of the control device and which are capable of coordinating the flow of electrical energy between the motor generator 3 and the electrical energy accumulators 5, 6 with a high level of operational reliability.

Figure 2:
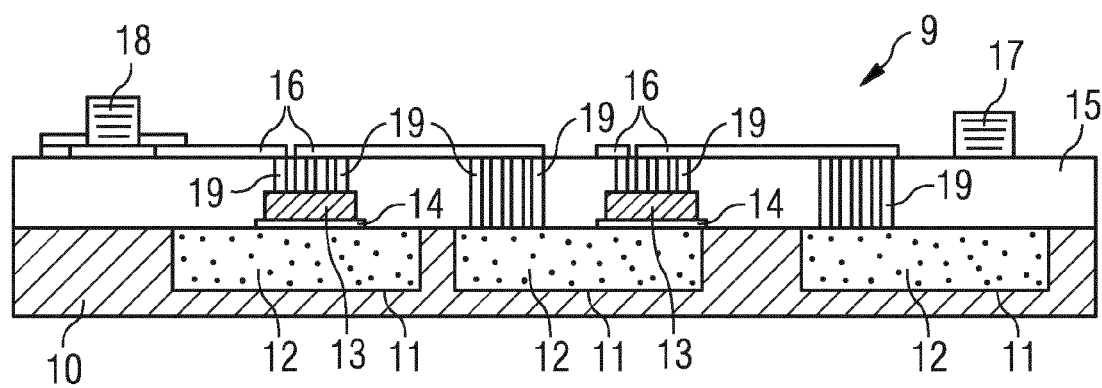
FIG. 2 shows a schematic illustration of an exemplary embodiment for a circuit board.

FIG. 2 is a schematic illustration of a cross section through an exemplary embodiment of a circuit board 9 for electric components. Such a circuit board 9 can be used in the control device 4 of the motor vehicle 1 (see FIG. 1) to switch the current flowing between the motor generator 3 and the electrical energy accumulators 5, 6.

The circuit board 9 has a carrier body 10 made of electrically insulating material (for example glass fiber mats steeped with epoxy resin). The carrier body 10 is illustrated individually in FIGS. 4A and 4B. The cutouts 11 for accommodating a current conductor are formed in the carrier body 10. The latter can be formed, for example, by subsequent milling of the carrier body 10. The cutouts can be embodied either as recesses (FIG. 4A) or as complete breakthroughs (FIG. 4B).

The circuit board (see FIG. 2) also has three current conductors 12 and two unhoused electric components 13 which are each provided directly on one of the current conductors 12 or attached directly thereto. The provision or attachment of the unhoused electric components 13 on the current conductors 12 is preferably carried out, depending on the application, by means of a highly thermally conductive and/or good electrically conductive intermediate layer 14. For example, the unhoused electric components 13 can be positioned on the current conductors 12 by means of a very good thermally conductive and electrically conductive solder or conductive adhesive or a thermally conductive adhesive film which is adhesive on both sides, and can be directly attached to said current conductors 12.

FIGS. 3A and 3B show such a current conductor 12 with an unhoused electric component 13 which is positioned thereon, in a side view (FIG. 3A) and in a cross-sectional view (FIG. 3B) along the sectional line A-A in FIG. 3A. The current conductor 12 is manufactured as a solid molded part composed of a material which is a very good conductor of current, preferably copper or a copper alloy. Said current conductor 12 preferably has a rectangular or square cross section and is dimensioned in such a way that it can conduct current with a current strength over 500 amperes.

As is apparent in FIG. 2, the current conductors 12 are inserted with the unhoused electric component 13 into the cutouts 11 of the carrier body 10. In the process, the cutouts 11 are advantageously adapted to the shape of the respective current conductor 12 in such a way that the current conductor 12 can be fitted into the cutouts 11 virtually without joints.

The circuit board 9 which is illustrated in FIG. 2 also has an electrically insulating layer 15 which at least partially covers the carrier body 10, the current conductors 12 and the unhoused electric components 13. This electrically insulating layer 15, which is also referred to as a "Prepreg" in the specialist jargon, is preferably composed of continuous fibers which are integrated in a plastic matrix. They can be pressed under high pressure and at high temperature onto the carrier body 10 with the current conductors 12 and the unhoused electric components 13 inserted therein, wherein the plastic matrix hardens in the process. A very reliable and electrically insulating layer is produced.

The circuit board 9 also has a layer 16 made of electrically conductive material which is embodied as a conductor structure. The electrically conductive layer 16 is preferably composed of a thin copper layer, wherein the conductor track structure is formed by an etching process. The electrically conductive layer 16 is applied to the electrically insulating layer 15, with the result that the electrically insulating layer 15 is arranged between the electrically conductive layer 16 and the carrier body 10. Further electric components 17 of the circuit board 9 can be placed in electrical contact with one another via this electrically conductive layer 16 which is embodied as a conductor track structure.

The circuit board 9 can have a multiplicity of further electric components 17 which are provided, by an equipping process, on the side on which the electrically conductive layer is also located. The electric components are connected here to the electric layer which is embodied as a conductor track structure and can be connected to one another. One or more of these components can be embodied as an electronic control system 18. This may be, for example, a microprocessor with a memory element.

In the electrically conductive layer 15, breakthroughs 19 are embodied in such a way that electrical contact can be formed between the unhoused electric components 13 and at least some of the current conductors 12 through these breakthroughs 19. In the exemplary embodiment, electrical contact can be formed between two unhoused electric components 13 and the central and the right-hand current conductors 12 (see FIG. 2) via the breakthroughs 19. The breakthroughs 19 can be milled over a large area or drilled as holes or microvias, depending on the application case.

In the exemplary embodiment in FIG. 2, the unhoused electric components 13 and the current conductors 12 are electrically connected to the electrically conductive layer 16 via the breakthroughs 19. This can be implemented, for example, in that during the application of the electrically conductive layer 16 to the electrically insulating layer 15, which is usually done by means of a galvanic process, the electrically conductive material also penetrates the breakthroughs. In this way, the current conductors 12 and the unhoused electric components 13, which are largely covered by the electrically insulating layer 15, can be electrically connected via the breakthroughs 19 to the electrically conductive layer 16 and also to any components 17, 18 on the surface of the circuit board 9.

In the exemplary embodiment in FIG. 2, the unhoused electric components 13 are semiconductor switches (for example power MOSFETs) which are connected, on the one hand, to the associated current conductor 12 via the thermally conductive and electrically conductive layer 14, but also to a further current conductor 12 of the current conductors 12 via the breakthroughs 19 and the electrically conductive layer 16. Furthermore, the unhoused electric components 13 are electrically connected to the electronic control system 18 of the circuit board via the breakthroughs 19 and the electrically conductive layer 16, with the result that the electronic control system 18 can vary the switched states of this semiconductor switch 13, depending on requirements.

It is therefore possible, for example, for the left-hand current conductor 12 to be connected to the electrostatic energy accumulator 6 (see FIG. 1), the central current conductor 12 to the motor generator 3 (see FIG. 1) and the right-hand current conductor 12 to the electrochemical energy accumulator 5 (see FIG. 1). Depending on the requirements, the electronic control system 18 can accordingly switch the unhoused semiconductor switches in such a way that the flow of current reaches the desired receiver.

Figure 5:
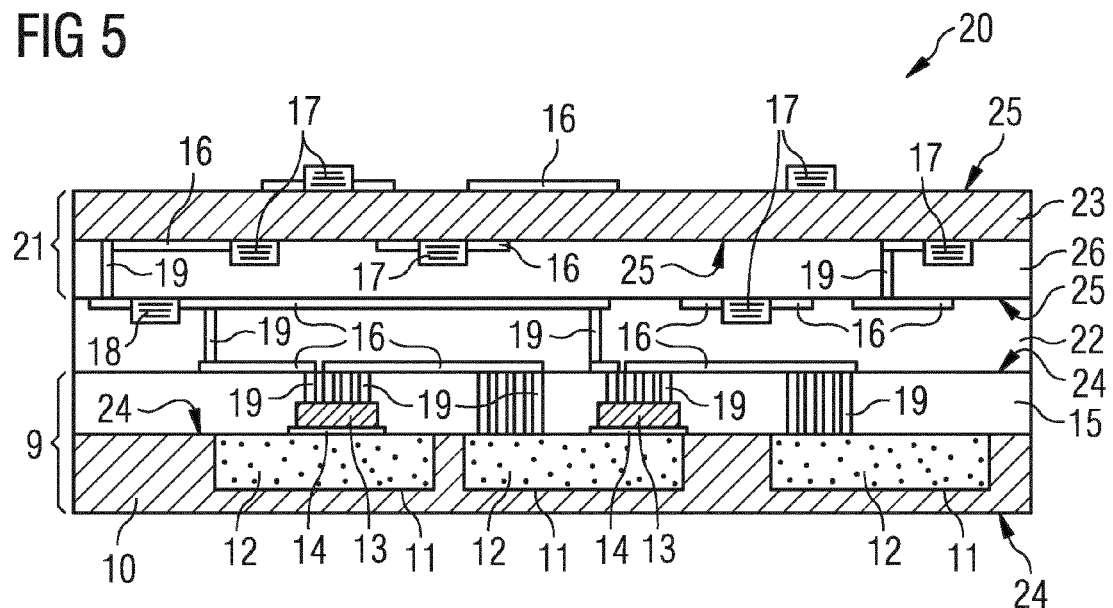
FIG. 5 shows a schematic illustration of a first exemplary embodiment of a circuit board system and FIG. 6 shows a schematic illustration of a second exemplary embodiment of a circuit board system.

FIG. 5 illustrates a first exemplary embodiment of a circuit board system 20 as can be used, for example, in the control device 18 of the motor vehicle 1 (FIG. 1). The circuit board system 20 has a first circuit board 9 such as is illustrated, for example, in FIG. 2, and a second circuit board 21 with electric components 17, wherein the two circuit boards 9, 21 are connected to one another via a connecting section 22 made of electrically insulating material.

In the exemplary embodiment in FIG. 5, the connecting section 22 is embodied as an electrically insulating layer between a main face 24 of the first circuit board 9 and a main face 25 of the second circuit board 21. Main face 24 or 25 is to be understood as a surface of the first circuit board 9 or of the second circuit board 21 which can be or is equipped with electric components 17. The connecting section 22 can be embodied as a Prepreg (continuous fiber embedded in a plastic matrix), and therefore connects the two main faces 24, 25 of the first circuit board 9 and of the second circuit board 21 in a fixed and reliably electrically insulating fashion.

In the exemplary embodiment in FIG. 5, the second circuit board 21 is equipped on both sides and embodied as a multi-layer circuit board (this is indicated purely schematically by multi-layer equipment of the underside of the second circuit board 21 with components). The second circuit board 21 has its own carrier body 23 made of electrically insulating material (glass fibers steeped with epoxy resin). In each case electrically conductive layers 16 (preferably copper) are applied to the main faces 25 of the circuit board 21 and are embodied as a conductor track structure. The electric components 17 are applied to the main faces 25 of the second circuit board 21 and connected to the conductor track structure. The individual layers are separated by a further electrically insulating layer 26 which has breakthroughs 19. Some electric components 17 of different layers are electrically connected to one another via the breakthroughs 19.

The connecting section 22, which is composed of electrically insulating material, between the first circuit board 9 and the second circuit board 21 also has breakthroughs 19, with the result that the electric components 17 of the first circuit board 9 and the electric components 17 of the second circuit board 21 are at least partially electrically connected to one another.

In this way it is possible that, for example, the electronic control system 18 for the semiconductor switches of the second circuit board is arranged and electrically connected via the breakthroughs to the unhoused semiconductor switches 13 of the first circuit board 9.

Figure 6:
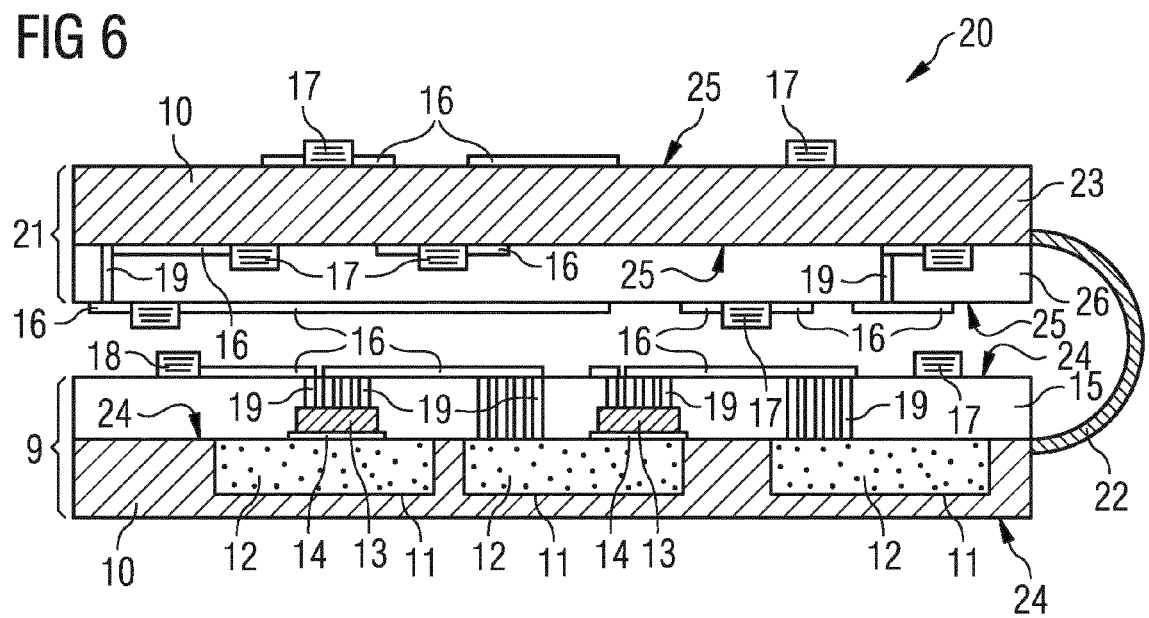

A further exemplary embodiment of the circuit board system is illustrated in FIG. 6. This exemplary embodiment differs from the exemplary embodiment in FIG. 5 in that the connecting section 22 is not embodied as an electrically insulating layer arranged between the main faces 24, 25. Instead, the first circuit board 9 and the second circuit board 21 have a common carrier body 10, wherein the connecting section 22 constitutes a section of the common carrier plate 10 which is located between the first circuit board 9 and the second circuit board 21. The connecting section 22 is shaped here in such a way that two main faces 24 and 25 of the first circuit board 9 or of the second circuit board 21 face one another. For this purpose, the connecting section 22 is bent through 180° degrees. In order to facilitate the bending process, the cross section of the connecting section can be tapered and heated for the bending process. This configuration of the circuit board system 20 provides very good electrical insulation between the two circuit boards 24 and 25 along with a small space requirement. Furthermore, this circuit board system 20 in FIG. 6 differs from the circuit board system 20 in FIG. 5 in that the electronic control system 18 for the semiconductor switches are arranged only on the first circuit board 9.

This electrical separation of the two circuit boards 24, 25 allows the first circuit board 9 to be embodied, for example, for high current applications and the second circuit board for low current applications.

The invention claimed is:

1. A circuit board for electric components, comprising:
   a carrier body;
   at least one current conductor on said carrier body, said at least one current conductor being configured as a molded part; and at least one unhoused electric component attached to said at least one current conductor;

at least one layer of electrically insulating material at least partially covering said carrier body, said at least one current conductor, and said at least one unhoused electric component; and said layer of electrically insulating material having formed therein at least one breakthrough for contacting therethrough said at least one unhoused electric component.

2. The circuit board according to claim 1, wherein said at least one current conductor is a solid ribbon conductor with a rectangular cross section.

3. The circuit board according to claim 1, wherein said at least one current conductor is configured to conduct current having a current strength above 500 amperes.

4. The circuit board according to claim 1, which further comprises an intermediate layer of heat-conducting material disposed to attach said unhoused electric component to said current conductor.

5. The circuit board according to claim 1, wherein:
said at least one current conductor is one of at least two current conductors each formed as a molded part;
said at least one unhoused electric component is a semiconductor switch attached to one of said current conductors and electrically connected to the other said current conductor through said at least one breakthrough formed in said electrically insulating layer.

6. The circuit board according to claim 1, further comprising an electronic control system electrically connected to said unhoused electric component through said breakthrough.

7. The circuit board according to claim 1, wherein said carrier body is formed with at least one cutout for accommodating said current conductor, and wherein said at least one current conductor is disposed in said cutout of said carrier body.

8. The circuit board according to claim 1, comprising a layer of electrically conductive material applied to said electrically insulating layer and configured as an electrical conductor structure, and wherein said at least one unhoused electric component is electrically connected to said electrically conductive layer through said at least one breakthrough.

9. A circuit board assembly, comprising:
a first circuit board according to claim 1;
a second circuit board with electric components; and
a connecting section of electrically insulating material connecting said first circuit board and said second circuit board.

10. The circuit board assembly according to claim 9, wherein said connecting section is an electrically insulating layer formed between a main face of said first circuit board and a main face of said second circuit board.

11. The circuit board assembly according to claim 9, wherein said first and second circuit boards have a common carrier body, a section of said common carrier body, disposed between said first circuit board and said second circuit board, constitutes said connecting section and is shaped such that two main faces of said first circuit board and of said second circuit board face one another.

12. The circuit board assembly according to claim 9, wherein at least one or both of said first circuit board or said second circuit board are formed as a multi-layer circuit board.

13. The circuit board assembly according to claim 9, wherein said second circuit board carries an electronic control system.

14. A motor vehicle, comprising:
at least one electric motor generator;
at least one electrical energy accumulator electrically connected to said motor generator; and
a control device configured for controlling a flow of electrical energy between said at least one electrical energy accumulator and said at least one motor generator, said control device having at least one circuit board according to claim 1.

* * * * *